United States Patent
Choi et al.

(10) Patent No.: US 8,895,440 B2
(45) Date of Patent: Nov. 25, 2014

(54) SEMICONDUCTOR DIE AND METHOD OF FORMING FO-WLCSP VERTICAL INTERCONNECT USING TSV AND TMV

(75) Inventors: DaeSik Choi, Seoul (KR); Young Jin Woo, Kyonggi-do (KR); TaeWoo Lee, Kyoungki-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 493 days.

(21) Appl. No.: 12/852,433

(22) Filed: Aug. 6, 2010

(65) Prior Publication Data

US 2012/0032340 A1 Feb. 9, 2012

(51) Int. Cl.
| | |
|---|---|
| *H01L 21/56* | (2006.01) |
| *H01L 21/768* | (2006.01) |
| *H01L 23/00* | (2006.01) |
| *H01L 21/78* | (2006.01) |
| *H01L 23/498* | (2006.01) |
| *H01L 23/31* | (2006.01) |
| *H01L 23/14* | (2006.01) |
| *H01L 25/10* | (2006.01) |

(52) U.S. Cl.
CPC ....... *H01L 21/78* (2013.01); *H01L 2224/04105* (2013.01); *H01L 2224/73253* (2013.01);

(Continued)

(58) Field of Classification Search
USPC .......................................... 438/675
See application file for complete search history.

(56) References Cited

U.S. PATENT DOCUMENTS 5,250,843 A * 10/1993 Eichelberger ................. 257/692
6,204,562 B1 3/2001 Ho et al.

(Continued)

*Primary Examiner* — Earl Taylor
(74) *Attorney, Agent, or Firm* — Robert A. Atkins; Patent Law Group: Atkins and Associates, P.C.

(57) ABSTRACT

A semiconductor device has a TSV wafer and semiconductor die mounted over the TSV wafer. A channel is formed through the TSV wafer. An encapsulant is deposited over the semiconductor die and TSV wafer. Conductive TMV are formed through the encapsulant over the conductive TSV and contact pads of the semiconductor die. The conductive TMV can be formed through the channel. A conductive layer is formed over the encapsulant and electrically connected to the conductive TMV. The conductive TMV are formed during the same manufacturing process. An insulating layer is formed over the encapsulant and conductive layer. A plurality of semiconductor die of the same size or different sizes can be stacked over the TSV wafer. The plurality of semiconductor die can be stacked over opposite sides of the TSV wafer. An internal stacking module can be stacked over the semiconductor die and electrically connected through the conductive TMV.

23 Claims, 10 Drawing Sheets

(52) U.S. Cl.
CPC ............ *H01L 2924/01049* (2013.01); *H01L 2224/24225* (2013.01); *H01L 2224/24146* (2013.01); *H01L 2924/01074* (2013.01); *H01L 2225/06541* (2013.01); *H01L 2225/06517* (2013.01); *H01L 2224/32145* (2013.01); *H01L 24/82* (2013.01); *H01L 2225/1035* (2013.01); *H01L 2224/32225* (2013.01); *H01L 2924/01005* (2013.01); *H01L 24/48* (2013.01); *H01L 2924/01082* (2013.01); *H01L 2224/97* (2013.01); *H01L 21/568* (2013.01); *H01L 23/49827* (2013.01); *H01L 24/29* (2013.01); *H01L 2924/01047* (2013.01); *H01L 2224/73267* (2013.01); *H01L 2924/01322* (2013.01); *H01L 2224/16227* (2013.01); *H01L 24/16* (2013.01); *H01L 21/561* (2013.01); *H01L 2924/13091* (2013.01); *H01L 2924/01013* (2013.01); *H01L 2224/92244* (2013.01); *H01L 2224/92* (2013.01); *H01L 2225/1023* (2013.01); *H01L 2225/1058* (2013.01); *H01L 2924/078* (2013.01); *H01L 2924/12041* (2013.01); *H01L 2924/09701* (2013.01); *H01L 2924/01006* (2013.01); *H01L 24/97* (2013.01); *H01L 2924/15311* (2013.01); *H01L 2924/01029* (2013.01); *H01L 2924/014* (2013.01); *H01L 2224/73265* (2013.01); *H01L 23/3128* (2013.01); *H01L 2924/01004* (2013.01); *H01L 2224/16225* (2013.01); *H01L 2924/01079* (2013.01); *H01L 2224/48227* (2013.01); *H01L 23/147* (2013.01); *H01L 2924/01073* (2013.01); *H01L 25/105* (2013.01); *H01L 24/24* (2013.01); *H01L 2924/01078* (2013.01); *H01L 23/49811* (2013.01); *H01L 2225/06572* (2013.01)
USPC ............ 438/675; 438/113; 438/127; 438/667

(56) References Cited

U.S. PATENT DOCUMENTS

| | | | |
|---|---|---|---|
| 6,429,530 B1 | 8/2002 | Chen | |
| 6,452,278 B1 * | 9/2002 | DiCaprio et al. | 257/777 |
| 6,492,726 B1 * | 12/2002 | Quek et al. | 257/723 |
| 6,552,426 B2 | 4/2003 | Ishio et al. | |
| 6,958,544 B2 * | 10/2005 | Sunohara | 257/758 |
| 7,122,901 B2 * | 10/2006 | Sunohara et al. | 257/758 |
| 7,405,486 B2 * | 7/2008 | Kato | 257/777 |
| 7,420,128 B2 * | 9/2008 | Sunohara et al. | 174/260 |
| 7,521,283 B2 * | 4/2009 | Machida et al. | 438/106 |
| 7,528,009 B2 | 5/2009 | Chen et al. | |
| 7,550,833 B2 * | 6/2009 | Mihara | 257/686 |
| 7,553,752 B2 * | 6/2009 | Kuan et al. | 438/613 |
| 7,576,440 B2 * | 8/2009 | Song et al. | 257/786 |
| 7,608,481 B2 * | 10/2009 | Masuda | 438/109 |
| 7,612,444 B2 * | 11/2009 | Chow et al. | 257/686 |
| 7,618,846 B1 * | 11/2009 | Pagaila et al. | 438/113 |
| 7,619,901 B2 * | 11/2009 | Eichelberger et al. | 361/763 |
| 7,633,765 B1 * | 12/2009 | Scanlan et al. | 361/760 |
| 7,642,633 B2 * | 1/2010 | Hirose et al. | 257/686 |
| 7,656,030 B2 * | 2/2010 | Osone et al. | 257/728 |
| 7,663,246 B2 * | 2/2010 | Chen et al. | 257/777 |
| 7,704,796 B2 * | 4/2010 | Pagaila et al. | 438/113 |
| 7,727,802 B2 * | 6/2010 | Sunohara et al. | 438/107 |
| 7,750,451 B2 * | 7/2010 | Camacho et al. | 257/686 |
| 7,825,520 B1 * | 11/2010 | Longo et al. | 257/777 |
| 7,843,042 B2 * | 11/2010 | Kuan et al. | 257/660 |
| 7,855,462 B2 * | 12/2010 | Boon et al. | 257/784 |
| 7,923,645 B1 * | 4/2011 | Huemoeller et al. | 174/255 |
| 7,960,827 B1 * | 6/2011 | Miller et al. | 257/712 |
| 8,063,475 B2 * | 11/2011 | Choi et al. | 257/686 |
| 8,093,711 B2 * | 1/2012 | Zudock et al. | 257/698 |
| 8,097,490 B1 * | 1/2012 | Pagaila et al. | 438/106 |
| 8,101,460 B2 * | 1/2012 | Pagaila et al. | 438/109 |
| 8,110,909 B1 * | 2/2012 | Hiner et al. | 257/686 |
| 8,183,130 B2 * | 5/2012 | Lee et al. | 438/462 |
| 8,188,584 B1 * | 5/2012 | Berry et al. | 257/678 |
| 8,189,344 B2 * | 5/2012 | Lee et al. | 361/790 |
| 8,236,617 B2 * | 8/2012 | Pagaila et al. | 438/122 |
| 8,258,012 B2 * | 9/2012 | Pagaila et al. | 438/113 |
| 8,269,342 B2 * | 9/2012 | Kim et al. | 257/720 |
| 8,273,604 B2 * | 9/2012 | Kim et al. | 438/113 |
| 8,341,835 B1 * | 1/2013 | Huemoeller et al. | 29/841 |
| 8,357,564 B2 * | 1/2013 | Chi et al. | 438/108 |
| 8,362,597 B1 * | 1/2013 | Foster | 257/659 |
| 8,367,470 B2 * | 2/2013 | Pagaila | 438/108 |
| 8,368,187 B2 * | 2/2013 | Pagaila | 257/660 |
| 8,384,203 B2 * | 2/2013 | Toh et al. | 257/687 |
| 8,455,995 B2 * | 6/2013 | Tsai et al. | 257/698 |
| 8,471,154 B1 * | 6/2013 | Yoshida et al. | 174/260 |
| 8,471,393 B2 * | 6/2013 | Meyer et al. | 257/784 |
| 2001/0008794 A1 * | 7/2001 | Akagawa | 438/620 |
| 2002/0140107 A1 * | 10/2002 | Kato et al. | 257/777 |
| 2003/0116836 A1 * | 6/2003 | Huang et al. | 257/678 |
| 2004/0119166 A1 * | 6/2004 | Sunohara | 257/758 |
| 2005/0211465 A1 * | 9/2005 | Sunohara et al. | 174/260 |
| 2005/0230835 A1 * | 10/2005 | Sunohara et al. | 257/758 |
| 2006/0003495 A1 * | 1/2006 | Sunohara et al. | 438/124 |
| 2006/0021791 A1 * | 2/2006 | Sunohara et al. | 174/255 |
| 2006/0040463 A1 * | 2/2006 | Sunohara | 438/424 |
| 2006/0087044 A1 * | 4/2006 | Goller | 257/783 |
| 2006/0249828 A1 * | 11/2006 | Hong | 257/686 |
| 2007/0059862 A1 | 3/2007 | Eng et al. | |
| 2007/0178667 A1 | 8/2007 | Lee et al. | |
| 2007/0190689 A1 | 8/2007 | Kaneko | |
| 2007/0218593 A1 * | 9/2007 | Masuda | 438/127 |
| 2007/0235216 A1 | 10/2007 | Bae et al. | |
| 2008/0099892 A1 * | 5/2008 | Chen et al. | 257/670 |
| 2008/0164618 A1 * | 7/2008 | Chow et al. | 257/777 |
| 2008/0185702 A1 * | 8/2008 | Camacho et al. | 257/686 |
| 2008/0242000 A1 | 10/2008 | Kwon et al. | |
| 2008/0246126 A1 * | 10/2008 | Bowles et al. | 257/659 |
| 2008/0258284 A1 * | 10/2008 | Trezza | 257/685 |
| 2008/0315372 A1 | 12/2008 | Kuan et al. | |
| 2009/0014858 A1 * | 1/2009 | Boon et al. | 257/686 |
| 2009/0199399 A1 * | 8/2009 | Kariya et al. | 29/832 |
| 2009/0267194 A1 * | 10/2009 | Chen | 257/621 |
| 2009/0302437 A1 * | 12/2009 | Kim et al. | 257/659 |
| 2009/0303690 A1 * | 12/2009 | Lee et al. | 361/767 |
| 2010/0078789 A1 * | 4/2010 | Choi et al. | 257/686 |
| 2010/0123241 A1 * | 5/2010 | Shi et al. | 257/698 |
| 2010/0133704 A1 * | 6/2010 | Marimuthu et al. | 257/778 |
| 2010/0193928 A1 * | 8/2010 | Zudock et al. | 257/686 |
| 2011/0018119 A1 * | 1/2011 | Kim et al. | 257/690 |
| 2011/0037156 A1 * | 2/2011 | Chandrasekaran et al. | 257/686 |
| 2011/0215458 A1 | 9/2011 | Camacho et al. | |
| 2012/0032340 A1 * | 2/2012 | Choi et al. | 257/774 |

* cited by examiner

US 8,895,440 B2

SEMICONDUCTOR DIE AND METHOD OF FORMING FO-WLCSP VERTICAL INTERCONNECT USING TSV AND TMV

FIELD OF THE INVENTION

The present invention relates in general to semiconductor devices and, more particularly, to a semiconductor device and method of forming a vertical interconnect using TSV and TMV in fan-out wafer level chip scale package (Fo-WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Most if not all Fo-WLCSP require a z-direction electrical interconnect structure for signal routing and package integration. Conventional Fo-WLCSP z-direction electrical interconnect structures exhibit one or more limitations. In one example, a conventional Fo-WLCSP contains a flipchip semiconductor die and encapsulant formed over the semiconductor die. An interconnect structure is typically formed over the semiconductor die and encapsulant for z-direction vertical interconnect. The flipchip semiconductor die is electrically connected to the interconnect structure with bumps. The bump interconnect makes package stacking difficult to achieve. In addition, the bumps are susceptible to delamination, particularly for applications requiring a fine interconnect pitch.

Another Fo-WLCSP interconnect structure is shown in U.S. Pat. No. 7,528,009 ('009 patent). A portion of the bottom silicon layer is removed between adjacent semiconductor die. An insulating layer is formed in the removed silicon area. A portion of the insulating layer is removed and an electrically conductive material is deposited to form a relatively large z-direction electrical interconnect for the semiconductor die. The large interconnect structure described in the '009 patent increases the pitch of the interconnect and size of the package and, which is counter to general miniaturization demands.

SUMMARY OF THE INVENTION

A need exists for a simple and cost effective Fo-WLCSP interconnect structure for applications requiring a fine interconnect pitch and vertical package integration. Accordingly, in one embodiment, the present invention is a method of making a semiconductor device comprising the steps of providing a semiconductor wafer having a plurality of conductive TSV formed through the semiconductor wafer, mounting the semiconductor wafer with the TSV to a carrier, cutting channels through the semiconductor wafer to provide a plurality of TSV wafer segments, mounting a semiconductor die to each TSV wafer segment, depositing an encapsulant over the semiconductor die and TSV wafer segment, forming a plurality of vias through the encapsulant over the conductive TSV and contact pads of the semiconductor die, depositing an electrically conductive material in the vias to form conductive TMV, forming a conductive layer over the encapsulant electrically connected to the conductive TMV, forming an insulating layer over the encapsulant and conductive layer, and singulating the semiconductor device through the channels.

In another embodiment, the present invention is a method of making a semiconductor device comprising the steps of providing a semiconductor wafer having a plurality of conductive TSV formed through the semiconductor wafer, mounting the semiconductor wafer with the TSV to a carrier, cutting a channel through the semiconductor wafer to provide a TSV wafer segment, mounting a semiconductor die to the TSV wafer segment, depositing an encapsulant over the semiconductor die and TSV wafer segment, forming a plurality of conductive TMV through the encapsulant over the conductive TSV and contact pads of the semiconductor die, forming a conductive layer over the encapsulant electrically connected to the conductive TMV, and forming an insulating layer over the encapsulant and conductive layer.

In another embodiment, the present invention is a method of making a semiconductor device comprising the steps of providing a TSV wafer having a plurality of conductive TSV formed through the wafer, mounting a semiconductor die to the TSV wafer, depositing an encapsulant over the semiconductor die and TSV wafer, and forming a plurality of conductive TMV through the encapsulant over the conductive TSV and contact pads of the semiconductor die.

In another embodiment, the present invention is a semiconductor device comprising a TSV wafer having a plurality of conductive TSV formed through the wafer. A semiconductor die is mounted to the TSV wafer. An encapsulant is deposited over the semiconductor die and TSV wafer. A plurality of conductive TMV is formed through the encapsulant over the conductive TSV and contact pads of the semiconductor die.

DETAILED DESCRIPTION OF THE DRAWINGS

Figure 1:
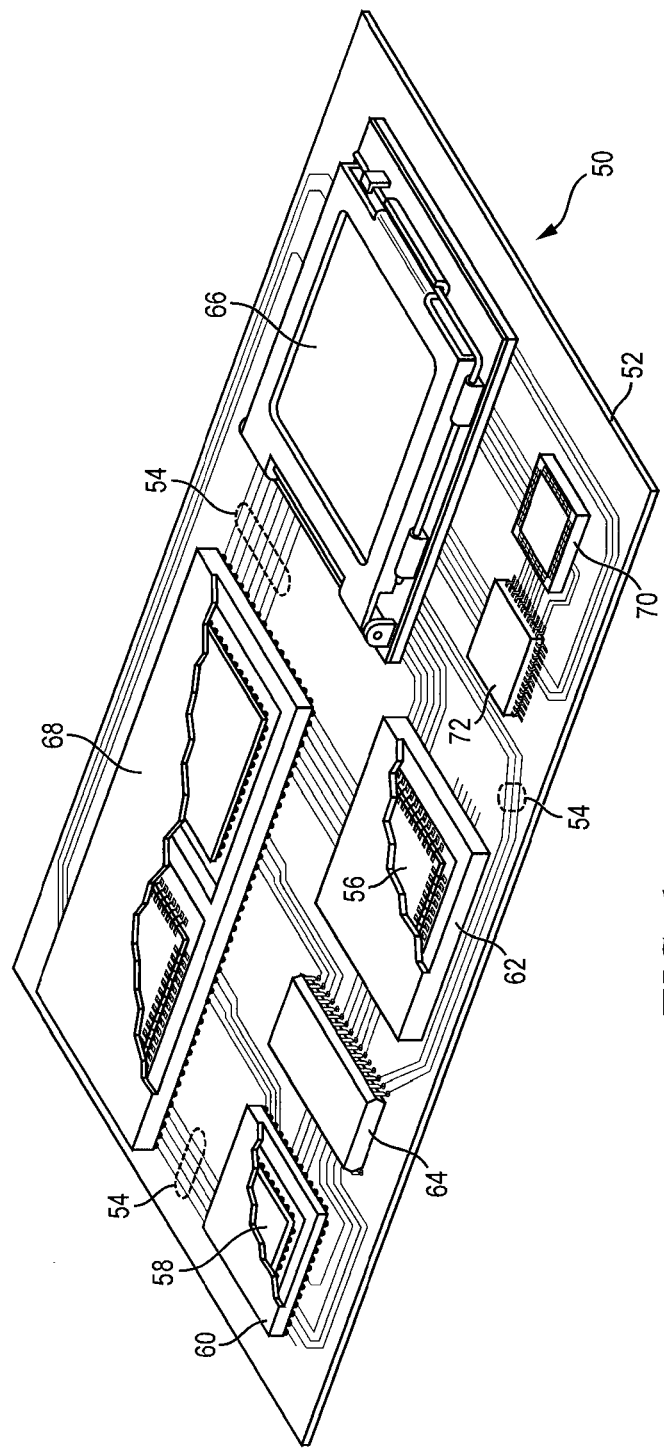
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
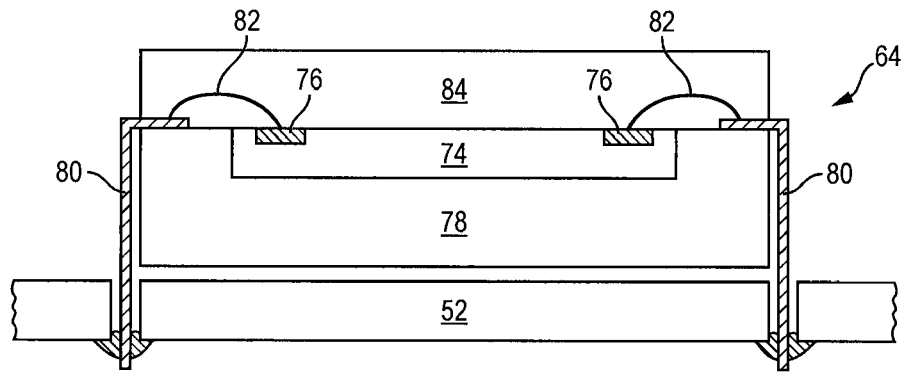
FIGS. 2a-2c illustrate further detail of the representative semiconductor packages mounted to the PCB.
Figure 2B:
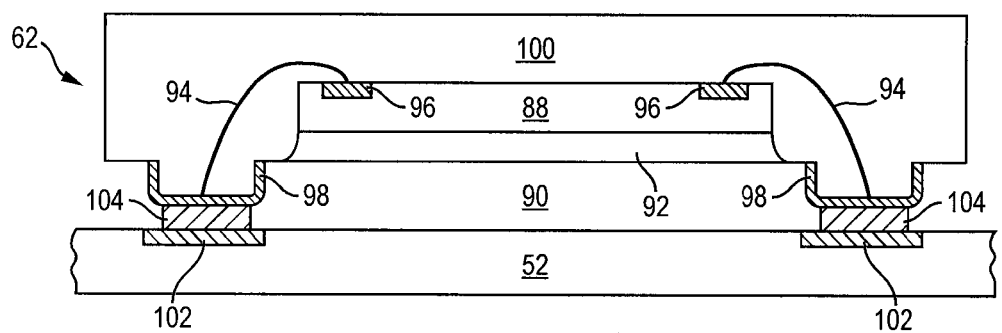
Figure 2C:
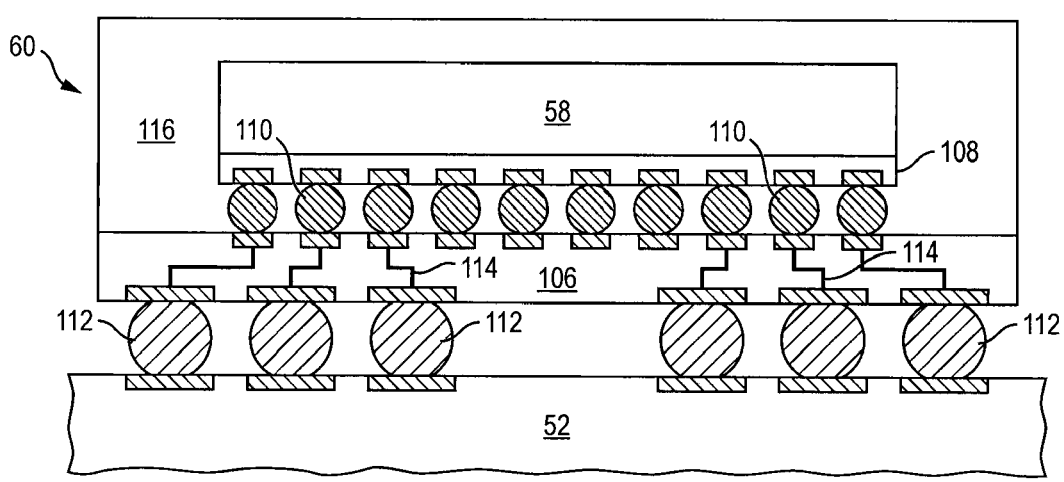

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110. p BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
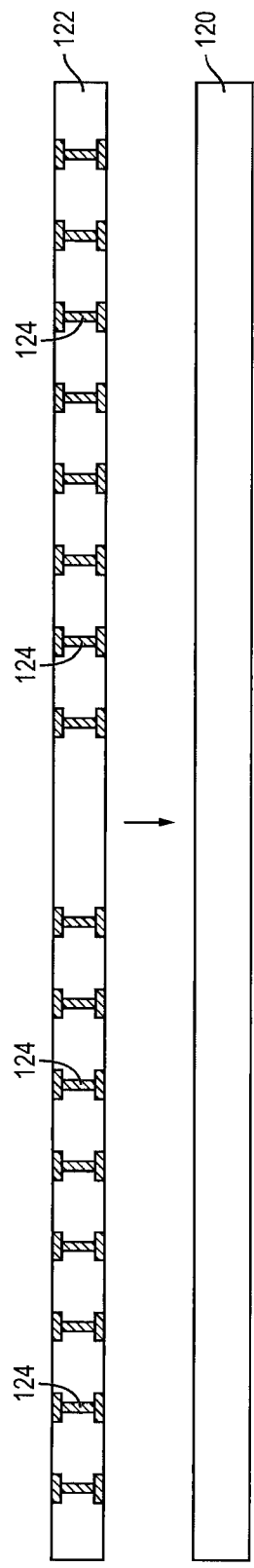
FIGS. 3a-3j illustrate a process of forming a vertical interconnect structure using TSV and TMV in a Fo-WLCSP.

FIGS. 3a-3j illustrate, in relation to FIGS. 1 and 2a-2c, a process of forming a vertical interconnect structure using TSV and TMV in a Fo-WLCSP. In FIG. 3a, a substrate or carrier 120 contains temporary or sacrificial base material such as silicon, polymer, polymer composite, metal, ceramic, glass, glass epoxy, beryllium oxide, or other suitable low-cost, rigid material for structural support.

Figure 3B:
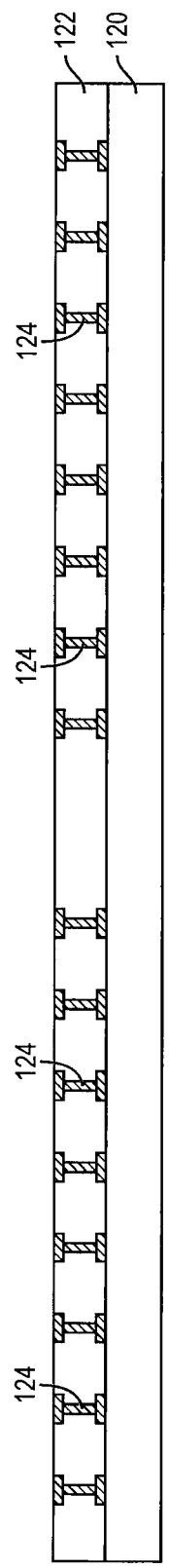

A semiconductor wafer 122 contains a base substrate material, such as silicon, germanium, gallium arsenide, indium phosphide, or silicon carbide, for structural support. A plurality of vias is formed through semiconductor wafer 122 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form z-direction conductive through silicon vias (TSV) 124. TSV wafer 122-124 is mounted to carrier 120, as shown in FIG. 3b.

Figure 3C:
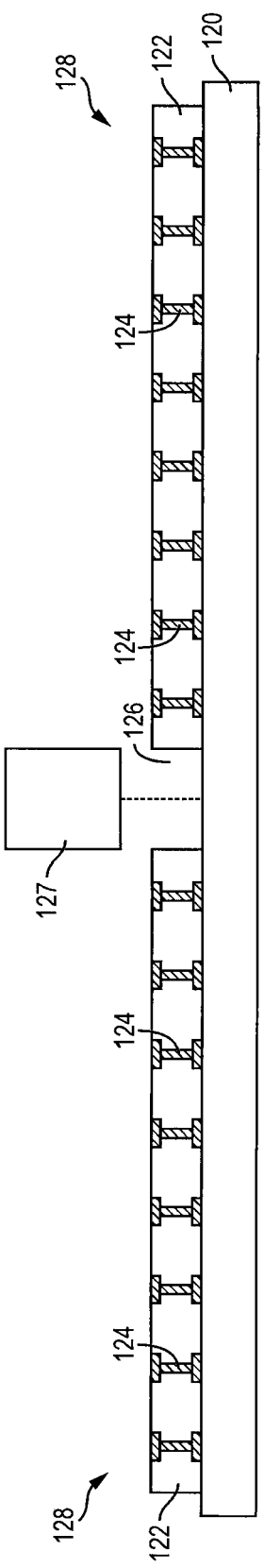

In FIG. 3c, a channel 126 is cut through semiconductor wafer 122 down to carrier 120 using saw blade or laser cutting tool 127 to create a plurality of TSV wafer portions or segments 128.

Figure 3D:
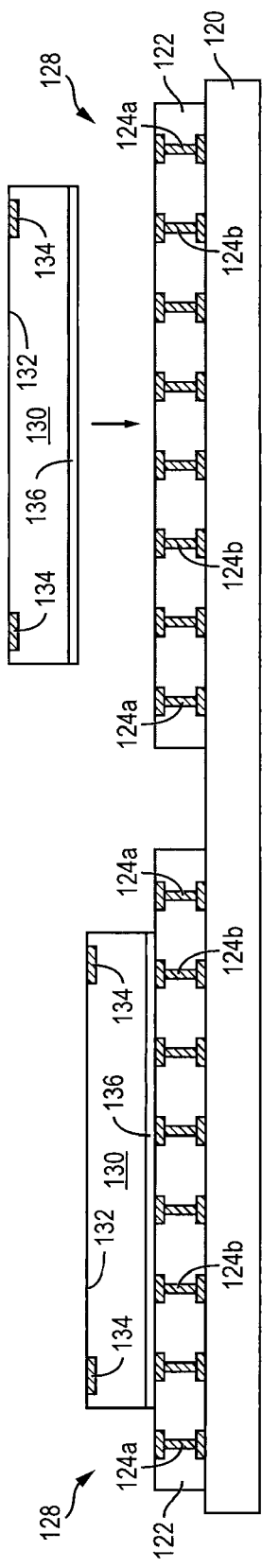

In FIG. 3d, semiconductor die 130 has an active surface 132 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 132 to implement analog circuits or digital circuits, such as digital signal processor (DSP), ASIC, memory, or other signal processing circuit. Semiconductor die 130 may also contain IPDs, such as inductors, capacitors, and resistors, for RF signal processing. In one embodiment, semiconductor die 130 is a flipchip type semiconductor die.

An electrically conductive layer 134 is formed over active surface 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads electrically connected to the circuits on active surface 132.

Semiconductor die 130 are mounted to TSV wafer segments 128 with die attach adhesive 136. Semiconductor die 130 each have smaller footprint than TSV wafer segment 128. Accordingly, TSV 124a around a perimeter of wafer segment 128 are outside the footprint of semiconductor die 130 and the remaining TSV 124b are disposed under semiconductor die 130.

Figure 3E:
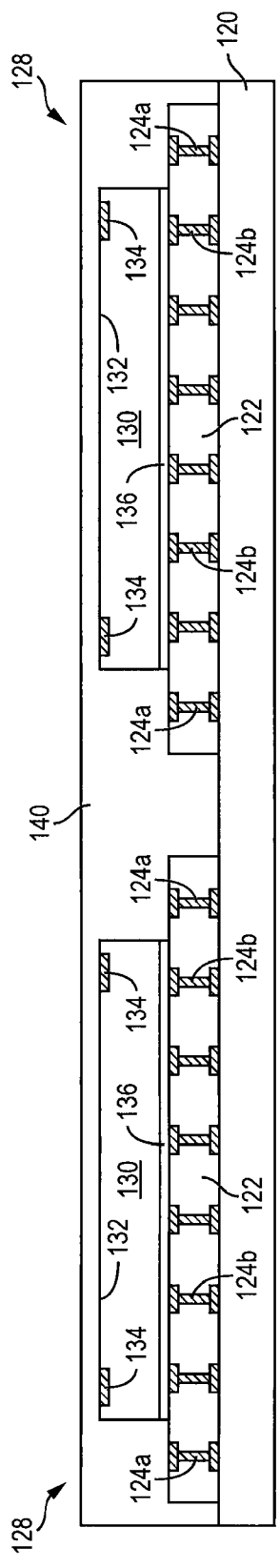

In FIG. 3e, an encapsulant or molding compound 140 is deposited over carrier 120, semiconductor die 130, and TSV wafer segments 128, including into channel 126, using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

Figure 3F:
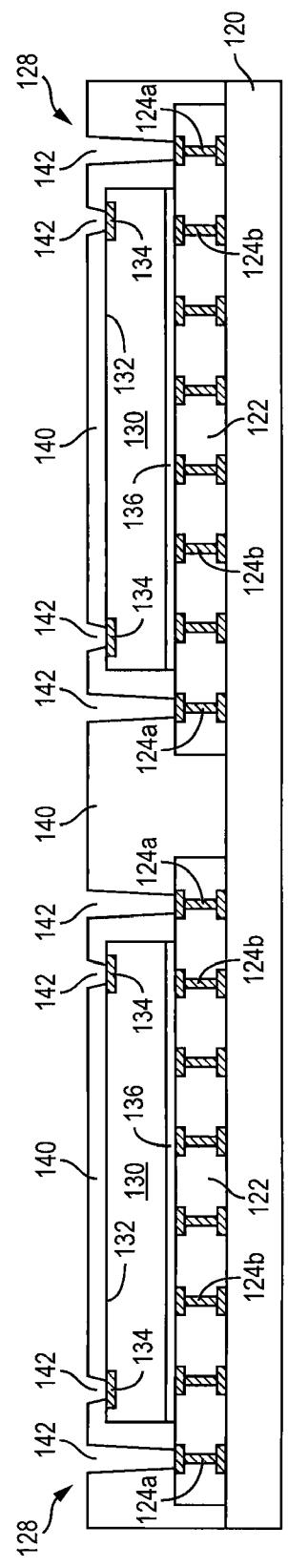
Figure 3G:
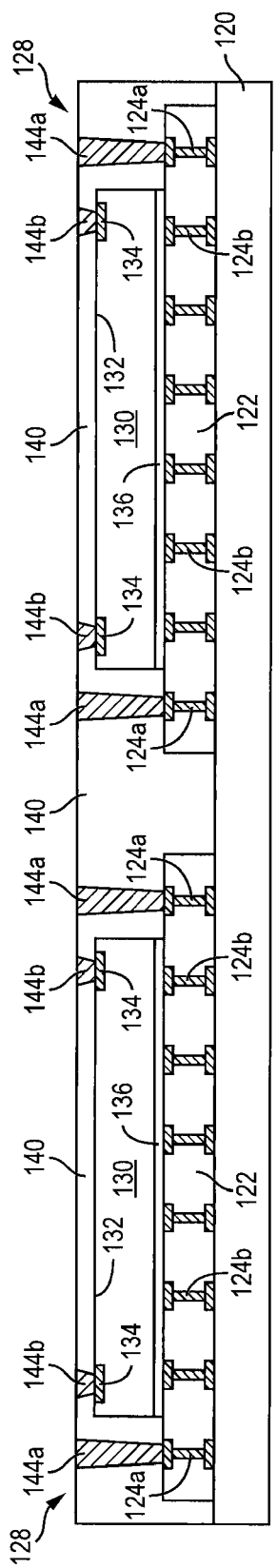

In FIG. 3f, a plurality of vias 142 is formed through encapsulant 140 over TSV 124a and contact pads 134 using mechanical drilling, laser drilling, mold chase, or DRIE. The vias 142 are filled with Al, Cu, Sn, Ni, Au, Ag, Ti, tungsten (W), poly-silicon, or other suitable electrically conductive material using electrolytic plating, electroless plating process, screen printing, or other suitable metal deposition process to form z-direction conductive through mold vias or pillars (TMV) 144, as shown in FIG. 3g. Conductive TMV 144a are electrically connected to TSV 124a, and conductive TMV 144b are electrically connected to contact pads 134. The formation of vias 142 and fill with conductive material to form conductive TMV 144 is performed during the same manufacturing step, which reduces cost in a mass production environment.

Figure 3H:
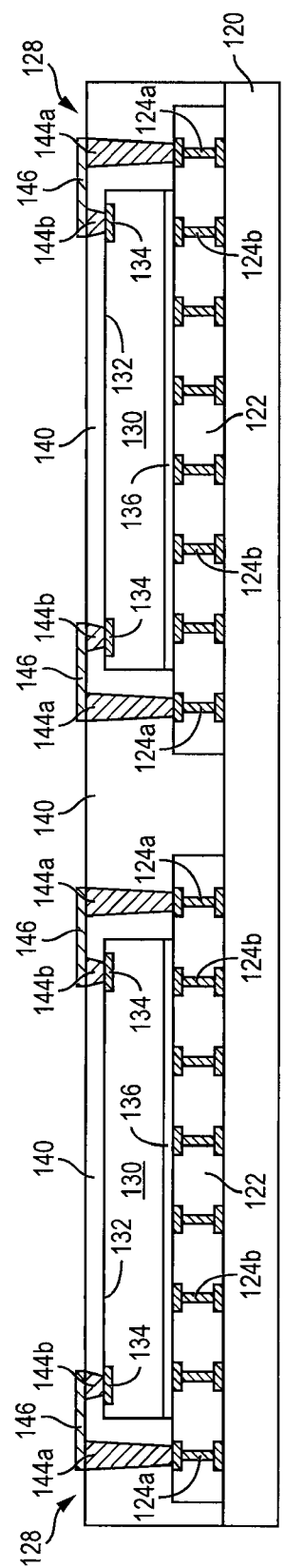

In FIG. 3h, an electrically conductive layer or redistribution layer (RDL) 146 is formed over encapsulant 140 and conductive TMV 144 using patterning and screen printing, electrolytic plating, electroless plating process, or other suitable metal deposition process. Conductive layer 146 can be one or more layers of Al, Cu, Sn, Ni, Au, Ag, or other suitable electrically conductive material. Conductive layer 146 is electrically connected to conductive TMV 144a and 144b. Additional RDL 146 can be formed over encapsulant 140 in an electrically common or electrically isolated arrangement depending on the design and function of semiconductor die 130.

Figure 3I:
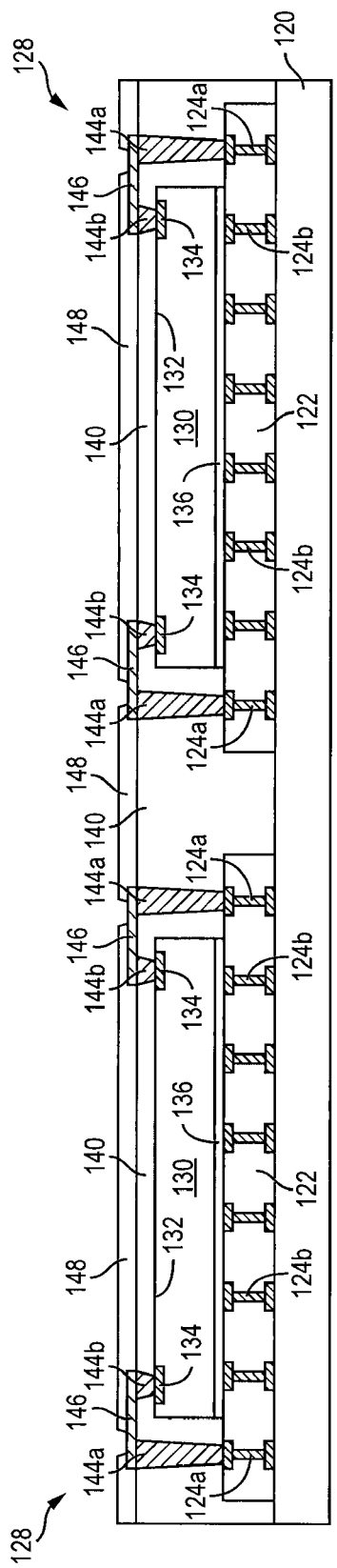

In FIG. 3i, an insulating or passivation layer 148 is formed over encapsulant 140 and conductive layer 146 by PVD, CVD, printing, spin coating, spray coating, or thermal oxidation. The insulating layer 148 can be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. A portion of insulating layer 148 is removed by an etching process to expose conductive layer 146 for bump formation or external electrical interconnect.

Figure 3J:
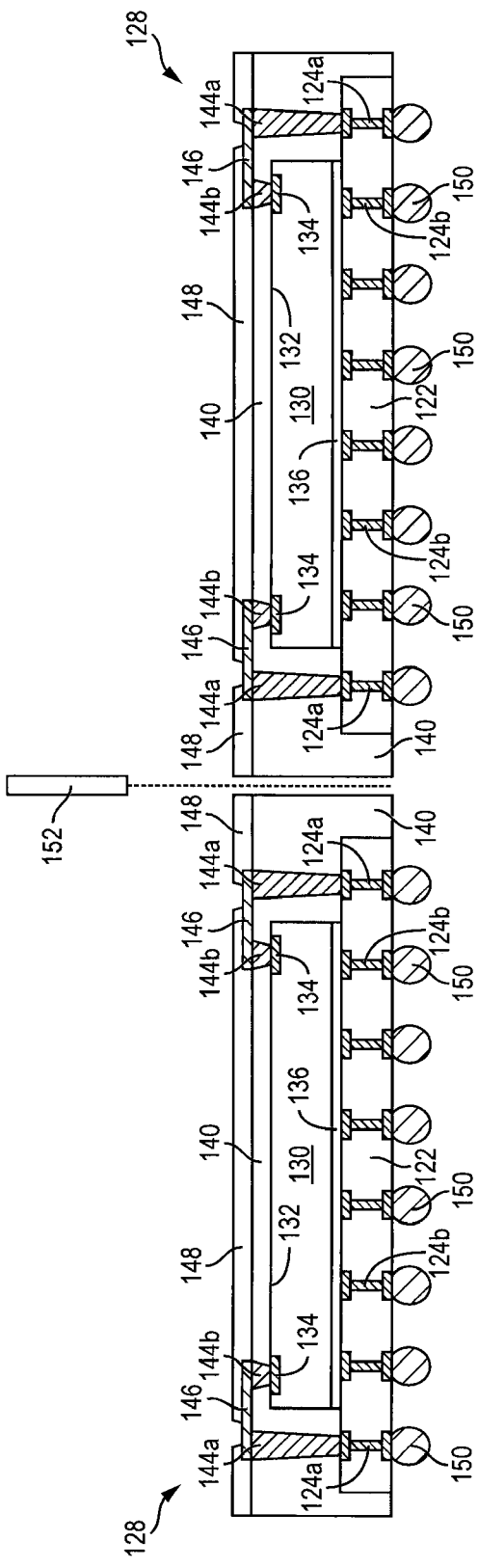

In FIG. 3j, carrier 120 is removed by chemical etching, mechanical peel-off, CMP, mechanical grinding, thermal bake, laser scanning, wet stripping, UV light, or heat. An electrically conductive bump material is deposited over the exposed conductive layer 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 146 using a suitable attachment or bonding process. In one embodiment, the bump material is reflowed by heating the material above its melting point to form spherical balls or bumps 150. In some applications, bumps 150 are reflowed a second time to improve electrical contact to conductive layer 146. An under bumps metallization (UBM) can be formed under bumps 150. The bumps can also be compression bonded to conductive layer 146. Bumps 150 represent one type of interconnect structure that can be formed over conductive layer 146. The interconnect structure can also use bond wires, stud bump, micro bump, or other electrical interconnect.

Figure 4:
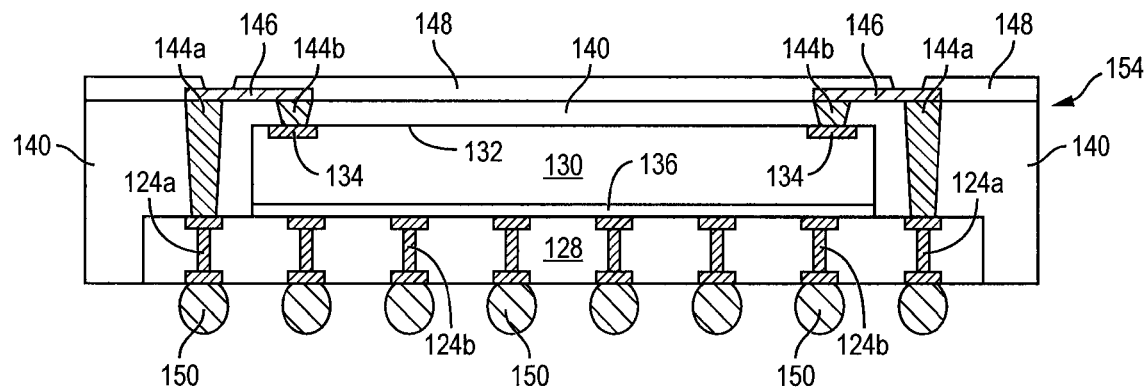
FIG. 4 illustrates the Fo-WLCSP with a TSV and TMV vertical interconnect structure.

Semiconductor die 130 and encapsulant 140 is singulated using saw blade or laser cutting tool 152 to separate the individual semiconductor die 130 into Fo-WLCSP 154, as shown in FIG. 4. Semiconductor die 130 is electrically connected to conductive TMV 144a and 144b, conductive layer 146, and conductive TSV 124a and 124b in wafer segment 128. TSV 124a and 124b can be electrically common or electrically isolated depending on the design and function of semiconductor die 130. The combination of conductive TSV 124 and conductive TMV 144 provide a fine pitch z-direction electrical interconnect for semiconductor die 130, which reduces the size of Fo-WLCSP 154. TSV wafer segment 128 has a CTE similar to semiconductor die 130 to reduce thermal stress.

Figure 5:
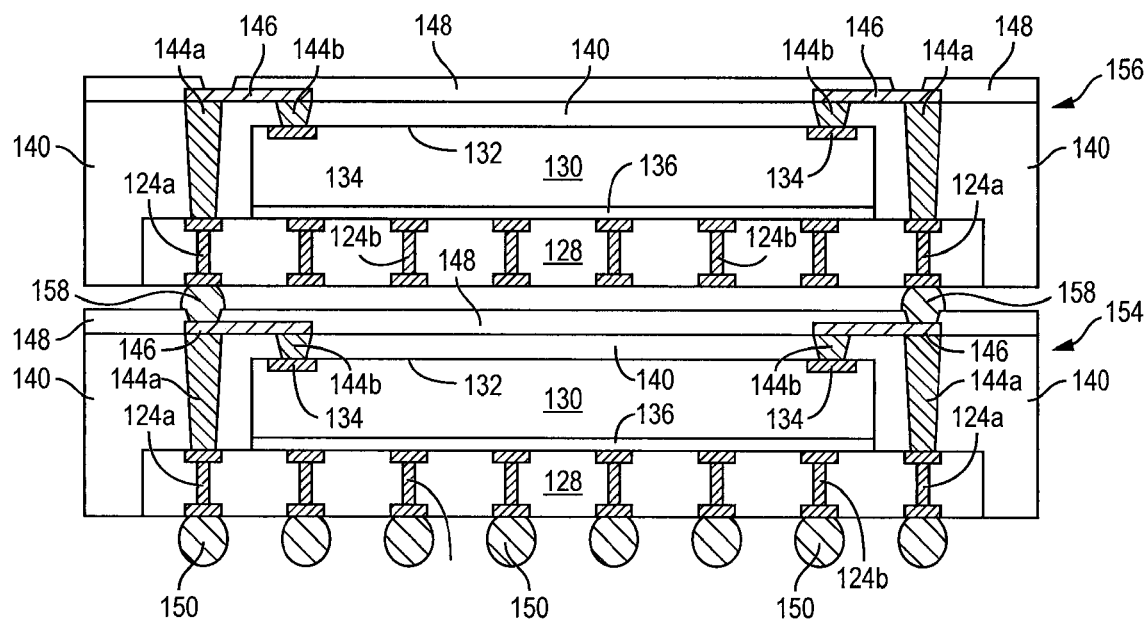
FIG. 5 illustrates stacked Fo-WLCSP each with a TSV and TMV vertical interconnect structure.

Fo-WLCSP 154 is suitable for package-on-package (PoP) or package-in-package (PiP) applications. FIG. 5 shows Fo-WLCSP 156 configured similar to Fo-WLCSP 154. Fo-WLCSP 156 is stacked over Fo-WLCSP 154 and electrically connected with bumps 158 formed between conductive layer 146 of Fo-WLCSP 154 and TSV 124a of Fo-WLCSP 156. Accordingly, semiconductor die 130 in Fo-WLCSP 154 and 156 are electrically connected through conductive TSV 124, TMV 144, conductive layer 146, and bumps 158.

Figure 6:
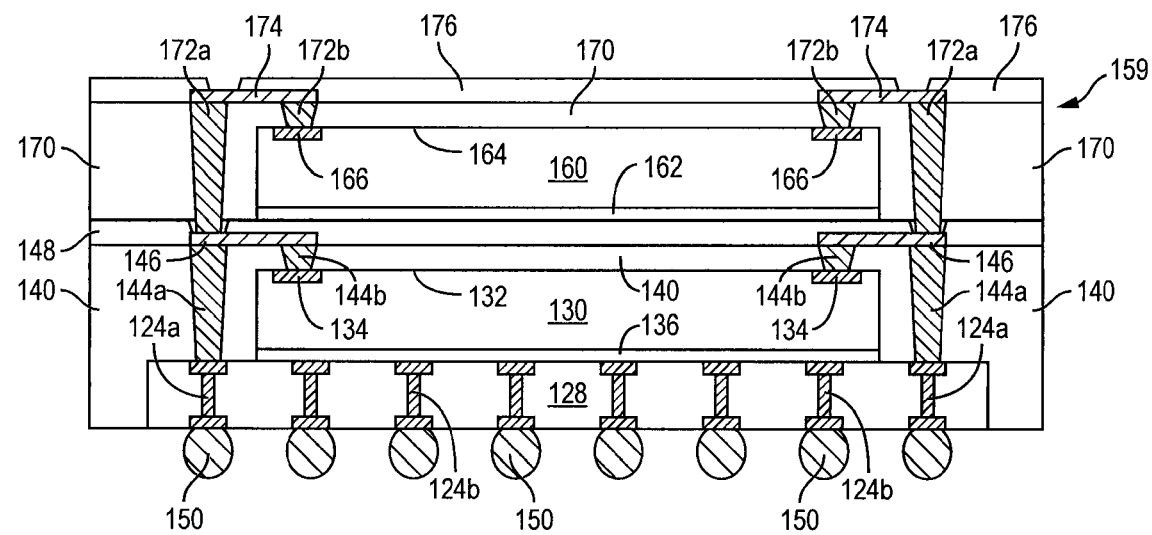
FIG. 6 illustrates another embodiment of stacked Fo-WLCSP each with a TSV and TMV vertical interconnect structure.

FIG. 6 shows an embodiment of Fo-WLCSP 159, similar to FIG. 4, with semiconductor die 160 mounted over insulating layer 148 with die attach adhesive 162. The stacked semiconductor die 130 and 160 increase the functional density of Fo-WLCSP 159. Semiconductor die 160 has an active surface 164 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 164 to implement analog circuits or digital circuits, such as DSP, ASIC, memory, or other signal processing circuit. Semiconductor die 160 may also contain IPDs, such as inductors, capacitors, and resistors, for RF signal processing. Contact pads 166 are formed on active surface 164 and electrically connected to the circuits on the active surface.

An encapsulant or molding compound 170 is deposited over semiconductor die 160 and insulating layer 148 using a paste printing, compressive molding, transfer molding, liquid encapsulant molding, vacuum lamination, spin coating, or other suitable applicator. Encapsulant 170 can be polymer composite material, such as epoxy resin with filler, epoxy acrylate with filler, or polymer with proper filler. Encapsulant 170 is non-conductive and environmentally protects the semiconductor device from external elements and contaminants.

A plurality of vias is formed through encapsulant 170 down to the exposed conductive layer 146 and contact pads 166 using mechanical drilling, laser drilling, mold chase, or DRIE. The vias are filled with Al, Cu, Sn, Ni, Au, Ag, Ti, W, poly-silicon, or other suitable electrically conductive material using electrolytic plating, electroless plating process, screen printing, or other suitable metal deposition process to form z-direction conductive TMV 172. Conductive TMV 172a are electrically connected to conductive layer 146, and conductive TMV 172b are electrically connected to contact pads 166. The formation of vias and fill with conductive material to form conductive TMV 172 is performed during the same manufacturing step, which reduces cost in a mass production environment.

An electrically conductive layer or RDL 174 is formed over encapsulant 170 and conductive TMV 172 using patterning and screen printing, electrolytic plating, electroless plating process, or other suitable metal deposition process. Conductive layer 174 can be one or more layers of Al, Cu, Sn, Ni, Au, Ag, or other suitable electrically conductive material. Conductive layer 174 is electrically connected to conductive TMV 172a and 172b. Additional RDL 174 can be formed over encapsulant 170 in an electrically common or electrically isolated arrangement depending on the design and function of semiconductor die 160.

An insulating or passivation layer 176 is formed over encapsulant 170 and conductive layer 174 by PVD, CVD, printing, spin coating, spray coating, or thermal oxidation. The insulating layer 176 can be one or more layers of SiO2, Si3N4, SiON, Ta2O5, Al2O3, or other material having similar insulating and structural properties. A portion of insulating layer 176 is removed by an etching process to expose conductive layer 174 for bump formation or external electrical interconnect. Semiconductor die 130 and 160 are electrically connected through conductive TMV 144, TMV 172, TSV 124, and conductive layers 146 and 174.

Figure 7:
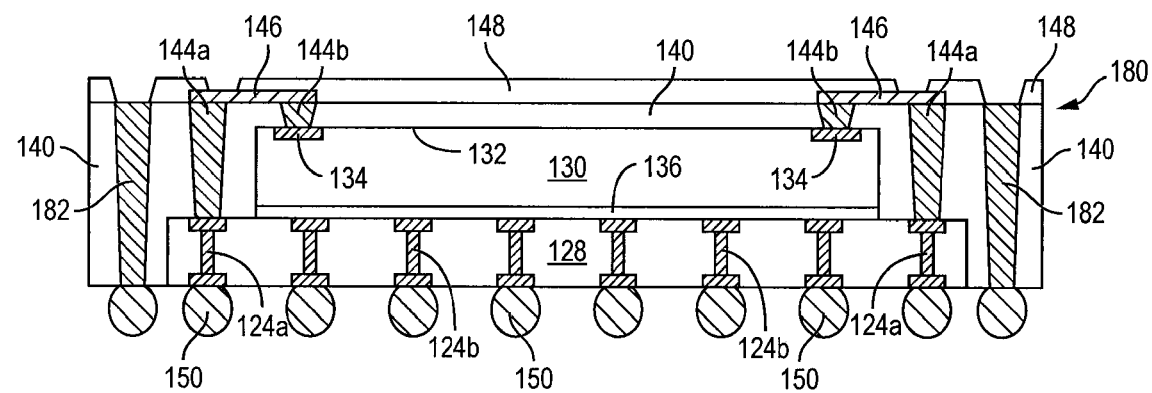
FIG. 7 illustrates the Fo-WLCSP with a TMV formed in the encapsulant channel.

FIG. 7 shows an embodiment of Fo-WLCSP 180, similar to FIG. 4, with conductive TMV 182 formed through encapsulant 140 in channel 126 between TSV wafer segments 128. A portion of insulating layer 148 is removed by an etching process to expose conductive TMV 182 for bump formation or external electrical interconnect.

Figure 8:
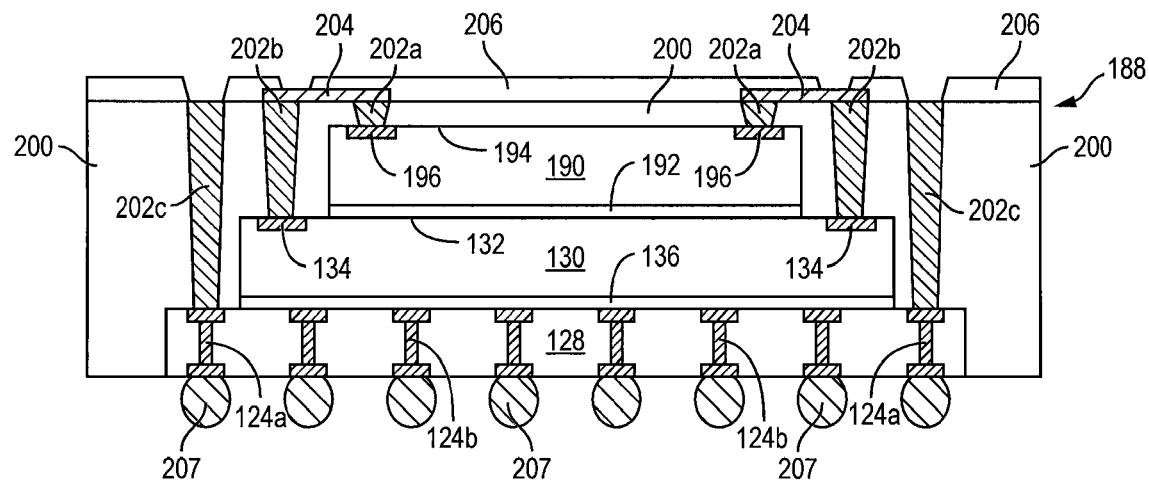
FIG. 8 illustrates tiered stacking of different size Fo-WLCSP each with a TSV and TMV vertical interconnect structure.

FIG. 8 shows an embodiment of Fo-WLCSP 188, continuing from FIG. 3d, with semiconductor die 190 mounted over semiconductor die 130 with die attach adhesive 192. Semiconductor die 130 and 190 are different in size and therefore stacked in a tiered arrangement. The tiered semiconductor die 130 and 190 increase the functional density of Fo-WLCSP 188. Semiconductor die 190 has an active surface 194 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 194 to implement analog circuits or digital circuits, such as DSP, ASIC, memory, or other signal processing circuit. Semiconductor die 190 may also contain IPDs, such as inductors, capacitors, and resistors, for RF signal processing. Contact pads 196 are formed on active surface 194 and electrically connected to the circuits on the active surface.

An encapsulant or molding compound 200 is deposited over semiconductor die 130 and 190 and TSV wafer segment 128 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive and environmentally protects the semiconductor device from external elements and contaminants.

A plurality of vias is formed through encapsulant 200 down to contact pads 134 and 196 and TSV 124a using mechanical drilling, laser drilling, mold chase, or DRIE. The vias are filled with Al, Cu, Sn, Ni, Au, Ag, Ti, W, poly-silicon, or other suitable electrically conductive material using electrolytic plating, electroless plating process, screen printing, or other suitable metal deposition process to form z-direction conductive TMV 202. Conductive TMV 202a are electrically connected to contact pads 196, conductive TMV 202b are electrically connected to contact pads 134, and conductive TMV 202c are electrically connected to TSV 124a. The formation of vias and fill with conductive material to form conductive TMV 202 is performed during the same manufacturing step, which reduces cost in a mass production environment.

An electrically conductive layer or RDL 204 is formed over encapsulant 200 and conductive TMV 202 using patterning and screen printing, electrolytic plating, electroless plating process, or other suitable metal deposition process. Conductive layer 204 can be one or more layers of Al, Cu, Sn, Ni, Au, Ag, or other suitable electrically conductive material. Conductive layer 204 is electrically connected to conductive TMV 202a and 202b. Additional RDL 204 can be formed over encapsulant 200 in an electrically common or electrically isolated arrangement depending on the design and function of semiconductor die 130 and 190.

An insulating or passivation layer 206 is formed over encapsulant 200 and conductive layer 204 by PVD, CVD, printing, spin coating, spray coating, or thermal oxidation. The insulating layer 206 can be one or more layers of SiO2, Si3N4, SiON, Ta2O5, Al2O3, or other material having similar insulating and structural properties. A portion of insulating layer 206 is removed by an etching process to expose conductive layer 204 and conductive vias 202c for bump formation or external electrical interconnect. Semiconductor die 130 and 190 are electrically connected through conductive TMV 202, TSV 124, and conductive layer 204. A plurality of bumps 207 is formed over TSV 124a and 124b.

Figure 9:
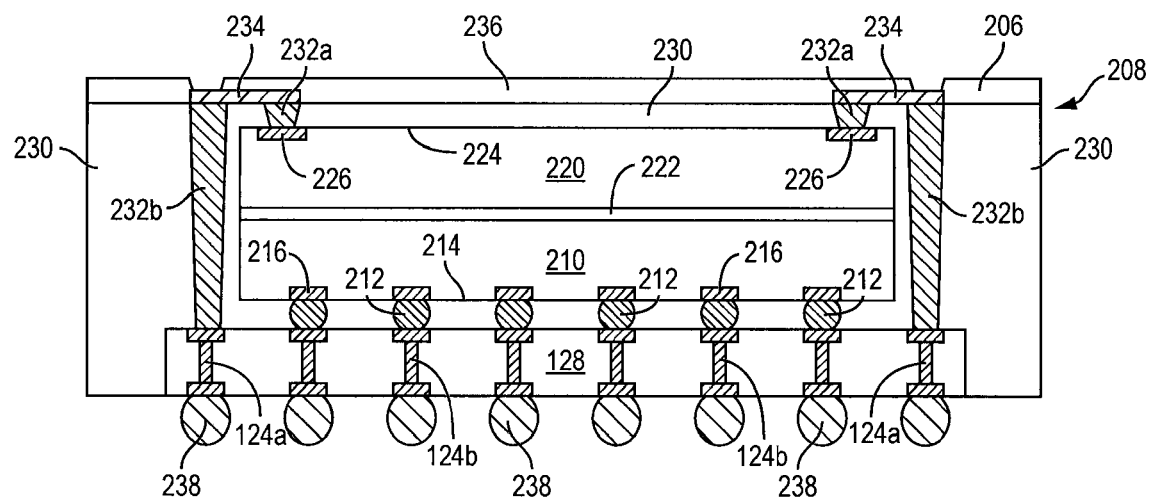
FIG. 9 illustrates stacking of same size Fo-WLCSP each with a TSV and TMV vertical interconnect structure.

FIG. 9 shows an embodiment of Fo-WLCSP 208, continuing from FIG. 3c, with semiconductor die 210 mounted over TSV wafer segment 128. In one embodiment, semiconductor die 210 is a flipchip type semiconductor die with bumps 212 formed between contact pads 216 and TSV 124b. Contact pads 216 are formed on active surface 214 and electrically connected to the circuits on the active surface. Semiconductor die 220 is mounted back-to-back with semiconductor die 210 with die attach adhesive 222. Semiconductor die 210 and 220 are similar in size. The stacked semiconductor die 210 and 220 increase the functional density of Fo-WLCSP 208. Contact pads 226 are formed on active surface 224 of semiconductor die 220 and electrically connected to the circuits on the active surface. Semiconductor die 210 and 220 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 210 and 220 may also contain IPDs, such as inductors, capacitors, and resistors, for RF signal processing.

An encapsulant or molding compound 230 is deposited over semiconductor die 210 and 220 and TSV wafer segment 128 using a paste printing, compressive molding, transfer molding, liquid encapsulant molding, vacuum lamination, spin coating, or other suitable applicator. Encapsulant 230 can be polymer composite material, such as epoxy resin with filler, epoxy acrylate with filler, or polymer with proper filler. Encapsulant 230 is non-conductive and environmentally protects the semiconductor device from external elements and contaminants.

A plurality of vias is formed through encapsulant 230 down to contact pads 226 and TSV 124a using mechanical drilling, laser drilling, mold chase, or DRIE. The vias are filled with Al, Cu, Sn, Ni, Au, Ag, Ti, W, poly-silicon, or other suitable electrically conductive material using electrolytic plating, electroless plating process, screen printing, or other suitable metal deposition process to form z-direction conductive TMV 232. Conductive TMV 232a are electrically connected to contact pads 226 and conductive TMV 232b are electrically connected to TSV 124a. The formation of vias and fill with conductive material to form conductive TMV 232 is performed during the same manufacturing step, which reduces cost in a mass production environment.

An electrically conductive layer or RDL 234 is formed over encapsulant 230 and conductive TMV 232 using patterning and screen printing, electrolytic plating, electroless plating process, or other suitable metal deposition process. Conductive layer 234 can be one or more layers of Al, Cu, Sn, Ni, Au, Ag, or other suitable electrically conductive material. Conductive layer 234 is electrically connected to conductive TMV 232a and 232b. Additional RDL 234 can be formed over encapsulant 230 in an electrically common or electrically isolated arrangement depending on the design and function of semiconductor die 210 and 220.

An insulating or passivation layer 236 is formed over encapsulant 230 and conductive layer 234 by PVD, CVD, printing, spin coating, spray coating, or thermal oxidation. The insulating layer 236 can be one or more layers of SiO2, Si3N4, SiON, Ta2O5, Al2O3, or other material having similar insulating and structural properties. A portion of insulating layer 236 is removed by an etching process to expose conductive layer 234 for bump formation or external electrical interconnect. Semiconductor die 210 and 220 are electrically connected through conductive TMV 232, TSV 124, and conductive layer 234. A plurality of bumps 238 is formed over TSV 124a and 124b.

Figure 10:
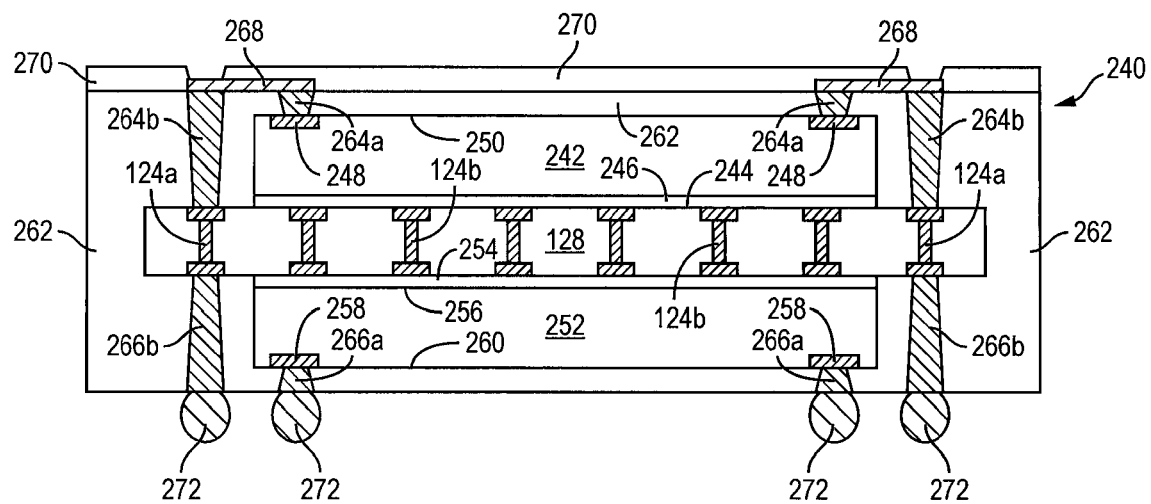
FIG. 10 illustrates stacking Fo-WLCSP on opposite sides of TSV wafer.

FIG. 10 shows an embodiment of Fo-WLCSP 240, continuing from FIG. 3c, with semiconductor die 242 mounted over surface 244 of TSV wafer segment 128 with die attach adhesive layer 246. Contact pads 248 are formed on active surface 250 of semiconductor die 242 and electrically connected to the circuits on the active surface. Semiconductor die 252 is mounted over surface 254 of TSV wafer segment 128, opposite surface 244, with die attach adhesive layer 256. Contact pads 258 are formed on active surface 260 of semiconductor die 252 and electrically connected to the circuits on the active surface. The semiconductor die 242 and 252 stacked on opposite surfaces 244 and 254 of TSV wafer segment 128 increase the functional density of Fo-WLCSP 240. Semiconductor die 242 and 252 each have an active surface containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 242 and 252 may also contain IPDs, such as inductors, capacitors, and resistors, for RF signal processing.

An encapsulant or molding compound 262 is deposited over semiconductor die 242 and 252 and surfaces 244 and 254 of TSV wafer segment 128 using a paste printing, compressive molding, transfer molding, liquid encapsulant molding, vacuum lamination, spin coating, or other suitable applicator. Encapsulant 262 can be polymer composite material, such as epoxy resin with filler, epoxy acrylate with filler, or polymer with proper filler. Encapsulant 262 is non-conductive and environmentally protects the semiconductor device from external elements and contaminants.

A plurality of vias is formed through encapsulant 262 down to contact pads 248 and 258 and both sides of TSV 124a using mechanical drilling, laser drilling, mold chase, or DRIE. The vias are filled with Al, Cu, Sn, Ni, Au, Ag, Ti, W, poly-silicon, or other suitable electrically conductive material using electrolytic plating, electroless plating process, screen printing, or other suitable metal deposition process to form z-direction conductive TMV 264 and 266. Conductive TMV 264a are electrically connected to contact pads 248 and conductive TMV 264b are electrically connected to one side of TSV 124a. Conductive TMV 266a are electrically connected to contact pads 258 and conductive TMV 266b are electrically connected to an opposite side of TSV 124a. The formation of vias and fill with conductive material to form conductive TMV 264 and 266 is performed during the same manufacturing step, which reduces cost in a mass production environment.

An electrically conductive layer or RDL 268 is formed over encapsulant 262 and conductive TMV 264 using patterning and screen printing, electrolytic plating, electroless plating process, or other suitable metal deposition process. Conductive layer 268 can be one or more layers of Al, Cu, Sn, Ni, Au, Ag, or other suitable electrically conductive material. Conductive layer 268 is electrically connected to conductive TMV 264a and 264b. Additional RDL 268 can be formed over encapsulant 262 in an electrically common or electrically isolated arrangement depending on the design and function of semiconductor die 242 and 252.

An insulating or passivation layer 270 is formed over encapsulant 262 and conductive layer 268 by PVD, CVD, printing, spin coating, spray coating, or thermal oxidation. The insulating layer 270 can be one or more layers of SiO2, Si3N4, SiON, Ta2O5, Al2O3, or other material having similar insulating and structural properties. A portion of insulating layer 270 is removed by an etching process to expose conductive layer 268 for bump formation or external electrical interconnect. Semiconductor die 242 and 252 are electrically connected through conductive TMV 264, TMV 266, TSV 124, and conductive layer 268. A plurality of bumps 272 is formed over TMV 266a and 266b.

Figure 11:
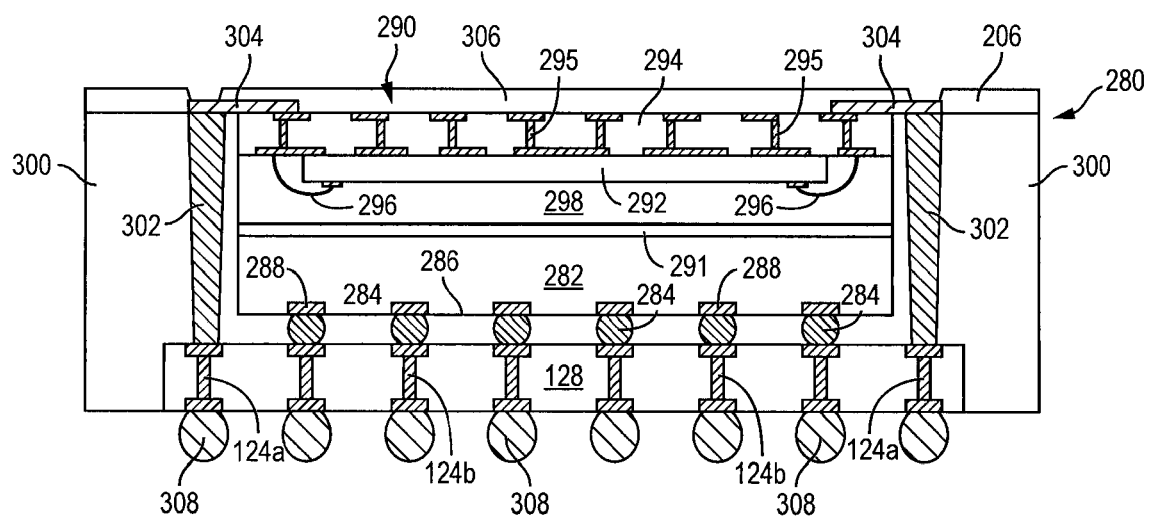
FIG. 11 illustrates stacking an ISM and Fo-WLCSP with a TSV and TMV vertical interconnect structure.

FIG. 11 shows an embodiment of Fo-WLCSP 280, continuing from FIG. 3c, with semiconductor die 282 mounted over TSV wafer segment 128 with bumps 284. In one embodiment, semiconductor die 282 is a flipchip type semiconductor die with bumps 284 formed between contact pads 288 and TSV 124b. Contact pads 288 are formed on active surface 286 and electrically connected to the circuits on the active surface. An internal stacking module (ISM) 290 is mounted to a back surface of semiconductor die 282 with die attach adhesive 291. ISM 290 contains semiconductor die 292 mounted to substrate 294 and electrically connected to conductive layers 295 in the substrate with bond wires 296. An encapsulant 298 is deposited over semiconductor die 292, substrate 294, and bond wires 296.

An encapsulant or molding compound 300 is deposited over semiconductor die 282, ISM 290, and TSV wafer segment 128 using a paste printing, compressive molding, transfer molding, liquid encapsulant molding, vacuum lamination, spin coating, or other suitable applicator. Encapsulant 300 can be polymer composite material, such as epoxy resin with filler, epoxy acrylate with filler, or polymer with proper filler. Encapsulant 300 is non-conductive and environmentally protects the semiconductor device from external elements and contaminants.

A plurality of vias is formed through encapsulant 300 down to TSV 124a using mechanical drilling, laser drilling, mold chase, or DRIE. The vias are filled with Al, Cu, Sn, Ni, Au, Ag, Ti, W, poly-silicon, or other suitable electrically conductive material using electrolytic plating, electroless plating process, screen printing, or other suitable metal deposition process to form z-direction conductive TMV 302. Conductive TMV 302 are electrically connected to TSV 124a. The formation of vias and fill with conductive material to form conductive TMV 302 is performed during the same manufacturing step, which reduces cost in a mass production environment.

An electrically conductive layer or RDL 304 is formed over encapsulant 300 and conductive TMV 302 using patterning and screen printing, electrolytic plating, electroless plating process, or other suitable metal deposition process. Conductive layer 304 can be one or more layers of Al, Cu, Sn, Ni, Au, Ag, or other suitable electrically conductive material. Conductive layer 304 is electrically connected to conductive TMV 302 and substrate 294. Additional RDL 304 can be formed over encapsulant 300 in an electrically common or electrically isolated arrangement depending on the design and function of semiconductor die 282 and ISM 290.

An insulating or passivation layer 306 is formed over encapsulant 300 and conductive layer 304 by PVD, CVD, printing, spin coating, spray coating, or thermal oxidation. The insulating layer 306 can be one or more layers of SiO2, Si3N4, SiON, Ta2O5, Al2O3, or other material having similar insulating and structural properties. A portion of insulating layer 306 is removed by an etching process to expose conductive layer 304 for bump formation or external electrical interconnect. Semiconductor die 282 and ISM 290 are electrically connected through conductive TMV 302, TSV 124, and conductive layer 304. A plurality of bumps 308 is formed over TSV 124a and 124b.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer containing semiconductor material including a plurality of conductive through silicon vias formed through the semiconductor material of the semiconductor wafer;
   cutting channels through the semiconductor wafer to provide a plurality of wafer segments including the conductive through silicon vias;
   disposing a first semiconductor die over a wafer segment from the plurality of wafer segments;
   depositing an encapsulant over the first semiconductor die and wafer segment;
   forming a first via through the encapsulant to expose a conductive through silicon via of the wafer segment;
   forming a second via through the encapsulant and over a contact pad of the first semiconductor die;
   depositing an electrically conductive material in the first and second vias during a same manufacturing step to form a first conductive through mold via extending through the encapsulant to the exposed conductive through silicon via and a second conductive through mold via extending through the encapsulant to the first semiconductor die;
   forming a conductive layer over the encapsulant electrically connected to the first and second conductive through mold vias; and
   forming an insulating layer over the encapsulant and conductive layer.

2. The method of claim 1, further including forming a plurality of bumps over the wafer segment opposite the first semiconductor die.

3. The method of claim 1, further including;
   stacking a second semiconductor die over the wafer segment; and
   electrically connecting the first and second semiconductor die through the first and second conductive through mold vias.

4. The method of claim 3, wherein the first and second semiconductor die are different sizes.

5. The method of claim 1, further including:
   stacking a second semiconductor die over the wafer segment opposite the first semiconductor die; and
   electrically connecting the first and second semiconductor die through the first and second conductive through mold vias.

6. The method of claim 1, further including forming a third conductive through mold via through the channels.

7. A method of making a semiconductor device, comprising:
- providing a semiconductor wafer including a plurality of conductive through silicon vias formed through the semiconductor wafer;
- cutting a channel through the semiconductor wafer to provide a wafer segment;
- disposing a semiconductor die over the wafer segment;
- depositing an encapsulant over the semiconductor die and wafer segment;
- forming a first conductive through mold via through the encapsulant and over the conductive through silicon vias;
- forming a second conductive through mold via through the encapsulant and over a contact pad of the semiconductor die;
- forming a conductive layer over the encapsulant and electrically connected to the first and second conductive through mold vias;
- forming an insulating layer over the encapsulant and conductive layer; and
- forming a third conductive through mold via through the channel.

8. The method of claim 7, further including:
- stacking a plurality of semiconductor die over the wafer segment; and
- electrically connecting the plurality of semiconductor die through the first and second conductive through mold vias.

9. The method of claim 7, further including:
- stacking a plurality of semiconductor die over opposite sides of the wafer segment; and
- electrically connecting the plurality of semiconductor die through the first and second conductive through mold vias.

10. The method of claim 7, further including:
- stacking an internal stacking module over the semiconductor die; and
- electrically connecting the semiconductor die and internal stacking module through the first and second conductive through mold vias.

11. The method of claim 7, further including forming a plurality of bumps over the wafer segment opposite the semiconductor die.

12. A method of making a semiconductor device, comprising:
- providing a substrate including a plurality of conductive vias formed through the substrate;
- disposing a semiconductor die over the substrate;
- depositing an encapsulant over the semiconductor die and substrate;
- forming a first via through the encapsulant to expose a conductive via of the substrate;
- forming a second via through the encapsulant and over a contact pad of the semiconductor die; and
- depositing an electrically conductive material in the first via and second via to form a first conductive through mold via extending through the encapsulant to the exposed conductive via of the substrate and
- a second conductive through mold via extending through the encapsulant to the semiconductor die.

13. The method of claim 12, further including:
- forming a conductive layer over the encapsulant and electrically connected to the first and second conductive through mold vias; and
- forming an insulating layer over the encapsulant and conductive layer.

14. The method of claim 12, further including:
- stacking a plurality of semiconductor die over the substrate; and
- electrically connecting the plurality of semiconductor die through the first and second conductive through mold vias.

15. The method of claim 14, wherein the plurality of semiconductor die are different sizes.

16. The method of claim 12, further including:
- stacking a plurality of semiconductor die over opposite sides of the substrate; and
- electrically connecting the plurality of semiconductor die through the first and second conductive through mold vias.

17. The method of claim 12, further including:
- stacking an internal stacking module over the semiconductor die; and
- electrically connecting the semiconductor die and internal stacking module through the first and second conductive through mold vias.

18. The method of claim 12, further including forming a plurality of bumps over the substrate opposite the semiconductor die.

19. A method of making a semiconductor device, comprising:
- providing a substrate including a plurality of conductive vias formed through the substrate;
- cutting channels through the substrate to provide a plurality of substrate segments including the conductive vias;
- disposing a first semiconductor die over a substrate segment from the plurality of substrate segments;
- depositing an encapsulant over the first semiconductor die and substrate segment;
- forming a first via through the encapsulant to expose a first conductive via of the substrate segment;
- forming a second via through the encapsulant and over a contact pad of the first semiconductor die; and
- depositing an electrically conductive material in the first via and second via to form a second conductive via extending through the encapsulant to the exposed first conductive via in the substrate segment and
- a third conductive via extending through the encapsulant to the first semiconductor die.

20. The method of claim 19, further including forming a conductive layer over the encapsulant and electrically connected to the second and third conductive vias.

21. The method of claim 19, further including:
- stacking a second semiconductor die over the first semiconductor die; and
- electrically connecting the first and second semiconductor die through the second and third conductive vias.

22. The method of claim 21, wherein the first and second semiconductor die are different sizes.

23. The method of claim 19, further including:
- stacking the first semiconductor die over a first side of the substrate segment;
- stacking a second semiconductor die over a second side of the substrate segment; and
- electrically connecting the first and second semiconductor die through the second and third conductive vias.

* * * * *